US005889402A

United States Patent [19]
Kumatoriya et al.

[11] Patent Number: 5,889,402
[45] Date of Patent: Mar. 30, 1999

[54] FERROMAGNETIC RESONANCE MEASURING CAVITY RESONATOR AND ELECTRON SPIN RESONANCE MEASURING APPARATUS HAVING SAME

[75] Inventors: Makoto Kumatoriya, Sendai; Takashi Fujii, Ohtsu, both of Japan

[73] Assignee: Murata Manufacturing Co., Ltd., Japan

[21] Appl. No.: 884,484

[22] Filed: Jun. 27, 1997

Related U.S. Application Data

[63] Continuation-in-part of Ser. No. 671,532, Jun. 27, 1996, abandoned.

[30] Foreign Application Priority Data

Jun. 28, 1995 [JP] Japan ................................ 7-186400

[51] Int. Cl.$^6$ .................................................. G01V 3/00
[52] U.S. Cl. ......................................... 324/321; 324/316
[58] Field of Search .................................. 324/321, 316, 324/312, 307, 309, 300

[56] References Cited

U.S. PATENT DOCUMENTS

| | | | |
|---|---|---|---|
| 4,547,754 | 10/1985 | Murakami et al. | 333/219 |
| 4,717,880 | 1/1988 | Ono et al. | 324/316 |
| 4,847,561 | 7/1989 | Soohoo | 324/316 |
| 5,212,449 | 5/1993 | Gentsch et al. | 324/316 |

FOREIGN PATENT DOCUMENTS 63-73174 4/1988 Japan .

OTHER PUBLICATIONS

M. Iketani et al., "ESR Microscope", Chapter 8, pp. 190–206, Springer–Verlag Tokyo, 1992 (with a partial translation).

J. D. Adam et al., "Non–Destructive Evaluation of YIG Films by Ferromagnetic resonance", IEE Transactions on Magnetics, vol. 25, No. 5, Sep. 1989, pp. 3488–3490.

S. Takeda et al., "Non–Destructive ΔH Measurement of LPE/YIG Wafer Using Terminated Straight Waveguide", IEE Transactions on Magnetics vol. 23, No. 5, Sep. 1987, pp. 3340–3342.

*Primary Examiner*—Louis M. Arana
*Attorney, Agent, or Firm*—Ostrolenk, Faber, Gerb & Soffen, LLP

[57] ABSTRACT

A ferromagnetic resonance measuring cavity resonator comprises a cavity resonator having a cavity formed by a side wall. The side wall is provided with an input/output hole and a through-hole. A ferromagnetic plate provided with a through-hole is mounted on the outside surface of the side wall such that the two through-holes are aligned. A wafer specimen is pressed against the ferromagnetic plate to face the through-hole. When microwaves are introduced into the cavity resonator, ferromagnetic resonance takes place based on the static magnetic field applied to the wafer specimen and the microwaves. As a result, a ferromagnetic resonance signal is detected via the input/output hole.

28 Claims, 6 Drawing Sheets

($H = 3.98 \times 10^5$ A/m)

($H = 4.22 \times 10^5$ A/m)

KITTEL MODE (H=4.13x10⁵A/M)

$(H = 4.22 \times 10^? \ A/m)$ 79.6 A/m

ΔH = 58.9 A/m

ΔH = 49.3 A/m

ΔH = 45.4 A/m

ΔH = 49.3 A/m

ΔH = 9.3 A/m

FERROMAGNETIC RESONANCE MEASURING CAVITY RESONATOR AND ELECTRON SPIN RESONANCE MEASURING APPARATUS HAVING SAME

This is a Continuation-in-Part of application Ser. No. 08/671,532 filed on Jun. 27, 1996 now abandoned.

BACKGROUND OF THE INVENTION

1. Field of the Invention

The present invention relates to an electron spin resonance (ESR) measuring apparatus, and more particularly to a ferromagnetic resonance (FMR) measuring apparatus and a cavity resonator to be used in the ferromagnetic resonance measuring apparatus.

2. Description of the Related Art

A ferromagnetic resonance (FMR) measurement is a kind of electron spin resonance (ESR) measurement and is employed for evaluating the magnetic properties of a magnetic material.

In the ferromagnetic resonance measurement, a cavity resonator having a cavity portion enclosed by a side wall is used. Microwaves are introduced into the cavity resonator, and a small spherical specimen or a small disk specimen is positioned where the intensity of the high-frequency magnetic field is maximum within the cavity resonator. Ferromagnetic resonance is caused by applying a static magnetic field while at the same time varying its strength. Based on measured ferromagnetic resonance signals, the resonance magnetic field, the ferromagnetic resonance half-value width, the saturation magnetization, the anisotropy field and the like are obtained.

As for ferromagnetic single crystals having a narrow ferromagnetic resonance half-value width, the aforementioned method using a cavity resonator is not used. Since a material having a narrow ferromagnetic resonance half-value width gives a high signal strength, a slight frequency variation in the cavity resonator may be the cause of a major error when ferromagnetic resonance takes place in the cavity resonator equipped with such a material. Thus, precise ferromagnetic resonance signals cannot be detected. In connection with ferromagnetic single crystals having a narrow ferromagnetic resonance half-value width, the cavity resonator has difficulty measuring the true value of the ferromagnetic resonance half-value width. It is contemplated that ferromagnetic resonance half-value width is measured by reducing the volume of a specimen to be as small as possible to make the relative signal strength small. For example, in the case of a ferromagnetic single crystal film wafer specimen that is epitaxially grown on a substrate having a size of a few centimeters across, the wafer specimen is cut into an individual 1 mm by 1 mm chip. This small chip is positioned inside the cavity resonator and ferromagnetic resonance half-value width is measured.

The conventional method has drawbacks. Specifically, in order to control the ferromagnetic resonance half-value width of ferromagnetic single crystal film wafers which are mass-produced, a small chip must be cut from each individual wafer. Thus, the cutting of small chips requires additional time thereby increasing the time required for measurement. Since a small chip is cut from an individual wafer, the yield of the chip production for devices from the wafer is also degraded. In addition, although the ferromagnetic resonance half-value width of a small chip cut from the wafer can be measured, the ferromagnetic resonance half-value width in a wafer having a larger area cannot be measured.

In order to solve the above problems, Japanese Laid-open Patent Application No. 63-73174 discloses a method of using a waveguide having a non-reflective terminal on one end and IEEE Transactions on Magnetics, 25, 3488-3490, 1989 discloses a method of using a short-circuit waveguide. In these methods, ferromagnetic resonance half-value width is measured without the need for cutting small chips from a ferromagnetic single crystal film wafer measuring a few centimeters wide. Although in the former method, a commercially available electron spin resonance measuring instrument can be used for measurement with the cavity resonator section replaced with a waveguide having a non-reflective terminal, ferromagnetic resonance measurements at arbitrary positions on the wafer is difficult because the ferromagnetic single crystal film wafer itself becomes a resonator. For this reason, this method is not suitable for the control of the ferromagnetic resonance half-value width of the ferromagnetic single crystal film wafer in practice. The latter method fails to present circuit compatibility with any commercially available electron spin resonance measuring instrument, and thus a new measuring system must be constructed.

SUMMARY OF THE INVENTION

It is therefore an object of the present invention to provide an electron spin resonance measuring apparatus having a ferromagnetic resonance measuring cavity resonator which measures the ferromagnetic resonance half-value width at any particular location on a ferromagnetic single crystal film wafer having a large area, which uses a commercially available electron spin resonance measuring instrument which does not need major modifications.

According to one aspect of the invention, a ferromagnetic resonance measuring cavity resonator includes: a cavity resonator having a cavity formed by a side wall, the side wall provided with a through-hole and an input/output hole; and a ferromagnetic plate having therein a through-hole, wherein the ferromagnetic plate is mounted on the side wall of the cavity resonator so that the through-hole formed in the side wall of the cavity resonator is aligned with the through-hole formed in the ferromagnetic plate.

In one embodiment, the through-hole of the ferromagnetic plate has substantially the same diameter as the through-hole of the side wall. Moreover, it is preferable that the diameter D of the through-hole formed in the side wall of the cavity resonator and the through-hole formed in the ferromagnetic plate is within the range of $0.0 < D \leq 3.0$ (mm).

According to another aspect of the invention, an electron spin resonance measuring apparatus is provided. The electron spin resonance measuring apparatus includes: a microwave generator; the aforementioned ferromagnetic resonance measuring cavity resonator electromagnetically connected with the microwave generator; a pair of electromagnets and a pair of magnetic modulation coils provided on the sides of the ferromagnetic resonance measuring cavity resonator to provide a uniform static magnetic field within the ferromagnetic resonance measuring cavity resonator; and a microwave sensor device electromagnetically connected to the ferromagnetic resonance measuring cavity resonator for detecting a ferromagnetic resonance signal.

According to the present invention, a static magnetic field is applied at right angles to the plane of measurement of the specimen. Since the microwaves are projected through the through-hole, a precise ferromagnetic resonance signal is obtained by pressing the ferromagnetic plate on the specimen. Thus, the apparent area of measurement of the specimen is the size of the through-hole and the ferromagnetic signal is obtained without frequency changes taking place in the resonator. Particularly, when the diameter D of the through-hole is within the range of 0.0<D≦3.0 (mm), good ferromagnetic resonance results.

Since a specimen having a large area can be measured using ferromagnetic resonance on the portion facing the through-hole, ferromagnetic resonance at any given location can be measured without the need for cutting the specimen into small chips. Therefore, ferromagnetic resonance is measured in short order and the yield of chips to be used as devices is improved.

These and other objects, features and advantages of the present invention will become more apparent when the following detailed description of the present invention is considered with the drawings.

DETAILED DESCRIPTION OF PREFERRED EMBODIMENTS

Figure 1:
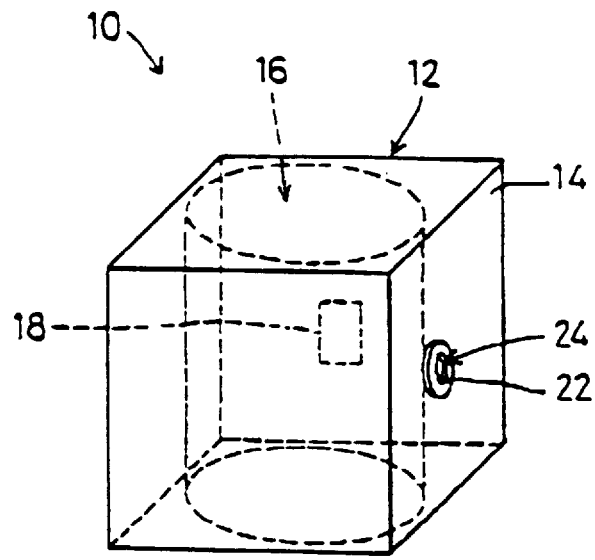
FIG. 1 is a diagrammatic view showing a ferromagnetic resonance cavity resonator according to an embodiment of the present invention.

The inventors of the present invention studied a method of using a commercially available electron spin resonance measuring apparatus (which would require no significant modifications) to measure ferromagnetic resonance of a ferromagnetic single crystal film wafer having a narrow ferromagnetic resonance half-value width.

Specifically, a through-hole was drilled in a side wall at a position of high intensity high-frequency magnetic field of a cavity resonator. A wafer specimen was pressed into contact with the outside of the cavity resonator and the cavity resonator and the wafer specimen were electromagnetically coupled via the through-hole. Using this method, putting the specimen into the cavity resonator is unnecessary and, in principle, a wafer of a few centimeters wide can produce a ferromagnetic resonance signal without the need for cutting the wafer into small chips. Attempts were made to measure the ferromagnetic resonance half-value width of the ferromagnetic single crystal film wafer, by reducing the diameter of the through-hole in the side wall of the cavity resonator to reduce the microwaves leakage via the through-hole and reduce the apparent area of the wafer specimen.

When the wafer specimen was measured using the aforementioned resonator, however, a distorted signal from which the ferromagnetic resonance half-value width could not be determined was obtained. It was therefore learned that controlling the properties of the ferromagnetic single crystal film wafer was impossible in quantity production. Let $\omega$ represent the frequency of a microwave, $\gamma$, a gyromagnetic ratio, $H_i$, an internal magnetic field, $H_{ex}$, an external magnetic field, $H_d$, a diamagnetic field, and $H_a$, an anisotropy field. The equations expressing ferromagnetic resonance conditions are as follows:

$$\omega = \gamma H_i \quad (1)$$

$$H_i = H_{ex} + H_d + H_a \quad (2)$$

When a wafer specimen having a large area is placed in a static magnetic field, the internal magnetic field in the specimen is irregularly distributed rather than intersecting the plane of the specimen at right angles, and thus precise ferromagnetic resonance signals that satisfy equation (1) cannot be obtained. For this reason, it is difficult to measure a signal corresponding to the Kittel-mode that appears when the spins in the ferromagnetic material are concurrently in precession, and it is thereby difficult to determine the ferromagnetic resonance half-value width. In the case of a wafer specimen having a large area, ferromagnetic resonance is detected, but a signal that allows the ferromagnetic resonance half-value width to be determined with sufficient accuracy cannot be obtained.

In order to solve this problem, the inventors have found that it is advantageous to mount a ferromagnetic plate on the side wall of the cavity resonator so that the through-hole formed in the side wall of the cavity resonator is aligned with the through-hole formed in the ferromagnetic plate. Thus, microwaves are leaked out through the two through-holes.

When a specimen is pressed into contact with the ferromagnetic plate, the specimen and the cavity resonator are electromagnetically coupled via the through-holes. If a static magnetic field perpendicular to the plane of the specimen is applied, the through-hole of the ferromagnetic plate develops a magnetic field distribution that is lower by approximately $10^4$ A/m than the other area. In a wafer specimen having a large area, the internal magnetic field Hi that satisfies equation (1) of the resonance conditions corresponds with the portion of the specimen facing the through-hole.

Since the lines of magnetic force in the through-hole are perpendicular to the plane of the wafer specimen, a uniform internal magnetic field results in the portion of the wafer specimen facing the through-hole. Therefore, ferromagnetic resonance measurements are performed only on the portion of the wafer specimen facing the through-hole. By keeping the diameter D of the through-holes formed in the cavity resonator and the ferromagnetic plate to within the range of 0.0<D≦3.0 (mm), a good measurement is obtained. The thickness of the ferromagnetic plate may be used to control the drop in the static magnetic field in the through-hole, where the amount of drop depends on the material of the ferromagnetic plate. It is preferable that an appropriate thickness be determined which depends on the ferromagnetic plate in use.

Hereinafter, the preferred embodiments of the present invention are explained in more detail with reference to the drawings.

Figure 2:
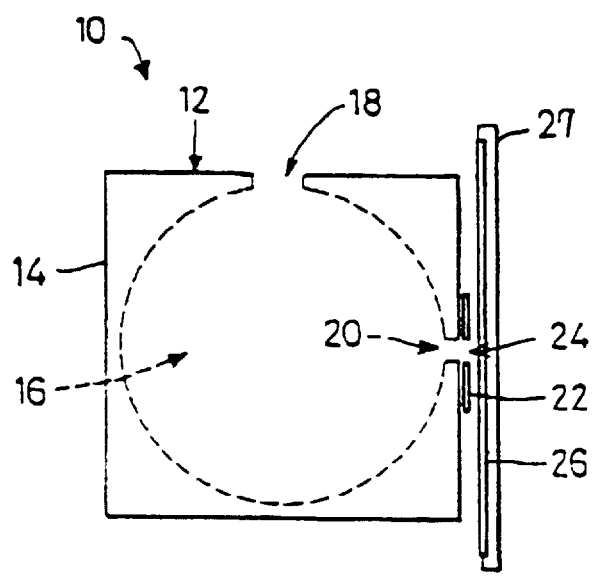
FIG. 2 is a diagrammatic view showing the wafer specimen pressed against the ferromagnetic resonance measuring cavity resonator of FIG. 1.

FIG. 1 is a diagrammatic view showing a ferromagnetic resonance measuring cavity resonator 10 according to an embodiment of the present invention. FIG. 2 is a diagrammatic view showing a wafer specimen that is pressed against the ferromagnetic resonance measuring cavity resonator. The ferromagnetic resonance measuring cavity resonator 10 comprises a cavity resonator 12. In this embodiment, the ES-WFCX manufactured by Nihon Denshi Co., Ltd. (a Japanese company) is used as the cavity resonator. The cavity resonator 12 comprises a side wall 14, which constitutes a cavity 16 inside. The cavity resonator 12 uses the TE011 mode and is designed to be operative in the X band (8 to 12 GHz).

The side wall 14 is provided with, for example, a square input/output hole 18 for inputting or outputting microwaves. Further, the side wall 14 is provided with a circular through-hole 20 (about 2 mm in diameter) that electromagnetically couples the cavity resonator 12 to a specimen to be measured. Mounted on the outside of the side wall 14, where the through-hole 20 is formed, is a ferromagnetic plate 22. In this embodiment, the ferromagnetic plate 22 is an iron plate having a 20 mm diameter and 0.1 mm thickness. A through-hole 24 having the same size as the through-hole 20 in the side wall 14 is present in the ferromagnetic plate 22. The ferromagnetic plate 24 is mounted on the side wall 14 50 that the through-hole 20 of the side wall 14 is aligned with the through-hole 24 of the ferromagnetic plate 22.

A wafer specimen 26 is supported by a holder 27 so as to be pressed against the outside surface of the ferromagnetic plate 22. In this embodiment, the wafer specimen 26 is a disk-like gadolinium gallium garnet ($Gd_3Ga_5O_{12}$) single crystal substrate having a diameter of 76 mm on which yttrium iron garnet ($Y_3Fe_5O_{12}$) single crystal film having a thickness of 20 $\mu$m is formed using the liquid phase epitaxial growth technique. The wafer specimen 26 is pressed against the through-hole 24 of the ferromagnetic plate 22. Therefore, the wafer specimen 26 is electromagnetically coupled to the cavity resonator 12 via the two through-holes 20 and 24.

Figure 3:
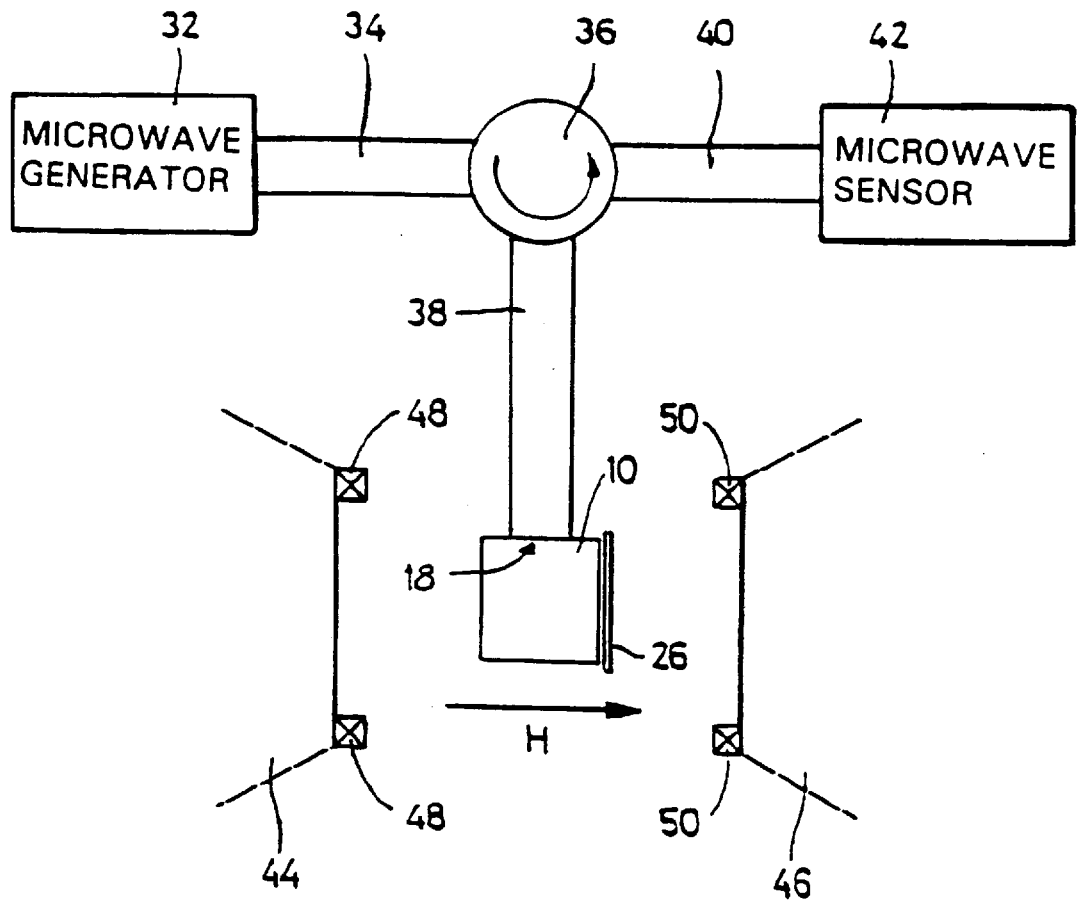
FIG. 3 is a diagrammatic view showing one example of the electron spin resonance measuring instrument for measuring the characteristics of the wafer specimen.

FIG. 3 shows an electron spin resonance measuring apparatus 30 according to the embodiment of the present invention. The magnetic characteristics of the wafer specimen 26 is measured using an electron spin resonance measuring instrument 30. In this embodiment, the JES-RE2X manufactured by Nihon Denshi Co., Ltd. (a Japanese company) is used as the electron spin resonance measuring instrument 30. The electron spin resonance measuring apparatus 30 comprises a microwave generator 32. The microwave generator 32 is electromagnetically connected to a circulator 36 via a waveguide 34. The circulator 36 is electromagnetically connected to the ferromagnetic resonance measuring cavity resonator 10 via a waveguide 38. The waveguide 38 is electromagnetically connected to the input/output hole 18 of the ferromagnetic resonance measuring cavity resonator 10. Therefore, the microwaves transmitted from the microwave generator 32 are introduced into the ferromagnetic resonance measuring cavity resonator 10 via the input/output hole 18.

The circulator 36 is also electromagnetically connected to a microwave sensor device 42 via a waveguide 40. The microwave sensor device 42 picks up a ferromagnetic resonance signal. The circulator 36 is used to guide the microwaves from the microwave generator 32 to the ferromagnetic resonance measuring cavity resonator 10 and to guide the ferromagnetic resonance signal from the ferromagnetic resonance measuring cavity resonator 10 to the microwave sensor device 42. Furthermore, electromagnets 44, 46 are provided on the sides of the ferromagnetic resonance measuring cavity resonator 10. The electromagnets 44, 46 are provided with magnetic modulation coils 48, 50 respectively to provide a uniform static magnetic field to the cavity resonator 12.

In the electron spin resonance measuring apparatus 30, the microwave generator 32 feeds a fixed wavelength microwave signal to the ferromagnetic resonance measuring cavity resonator 10. The electromagnets 44, 46 apply the static magnetic field to the ferromagnetic resonance measuring cavity resonator 10, and the microwave sensor device 42 detects a ferromagnetic resonance signal that is generated when ferromagnetic resonance takes place.

Although a uniform static magnetic field is applied to the outside of the wafer specimen, it is usually difficult to obtain a uniform internal magnetic field within the wafer specimen. In the ferromagnetic resonance measuring cavity resonator 10 of the present invention, however, the ferromagnetic plate 22 causes a static magnetic field to develop within the through-hole 24 that is lower, by approximately $10^4$ A/m, than that in the remaining portion. Further, uniform lines of magnetic force in perpendicular relation to the plane of the specimen are obtained. As a result, a uniform internal magnetic field distribution that intersects the plane of the specimen at right angles exists through the area of the wafer specimen 26 facing the through-hole 24. Therefore, a precise ferromagnetic resonance signal is derived from the area of the wafer specimen 26 facing the through-hole 24.

Since the area of measurement faces the through-hole 24, the apparent area of measurement is reduced to the diameter of the through-hole 24 even when the wafer specimen 26 has a larger area. This arrangement works the same way as when a small chip is used as a specimen and is positioned inside the cavity resonator 12, whereby frequency changes in the cavity resonator 12 during ferromagnetic resonance are prevented. Therefore, even when the wafer specimen 26 having a larger area is measured, the wafer specimen 26 may be measured at any arbitrary location by shifting the wafer specimen 26 relative to the through-hole 24 of the ferromagnetic plate 22.

Figure 4A:
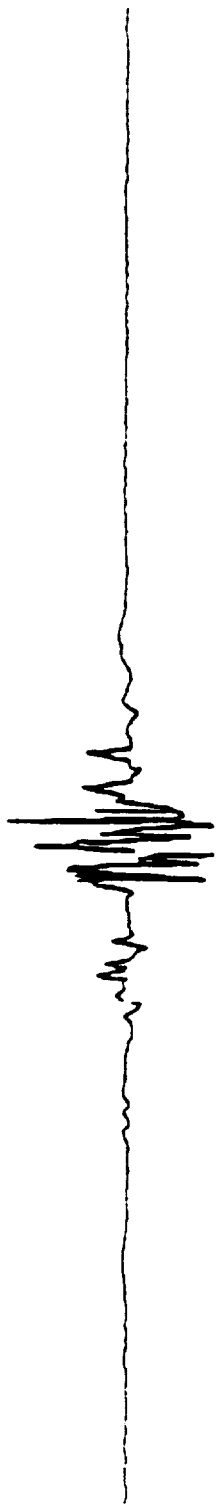
FIGS. 4A, 4B and 4C are waveform diagrams showing ferromagnetic resonance signals when the ferromagnetic resonance measuring cavity resonator of this invention and the prior art cavity resonator are used.
Figure 4B:
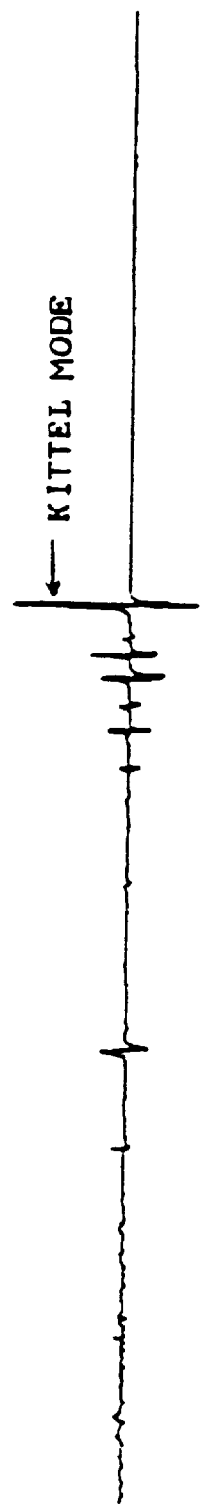
Figure 4C:
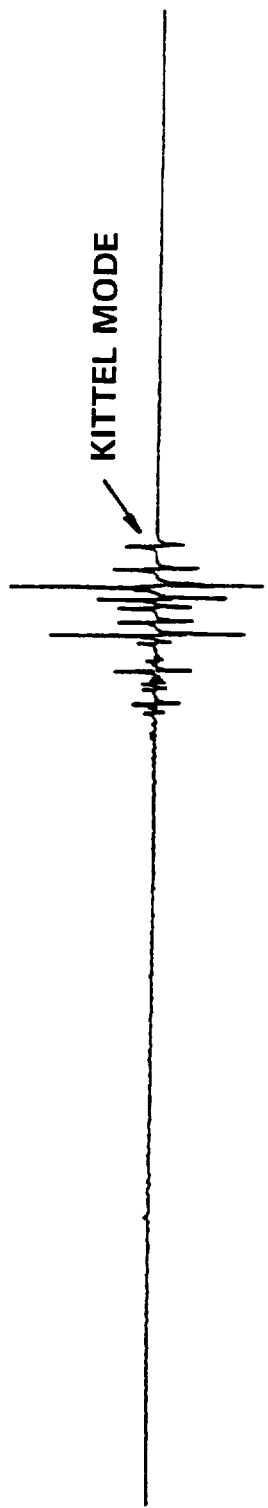
Figure 6A:
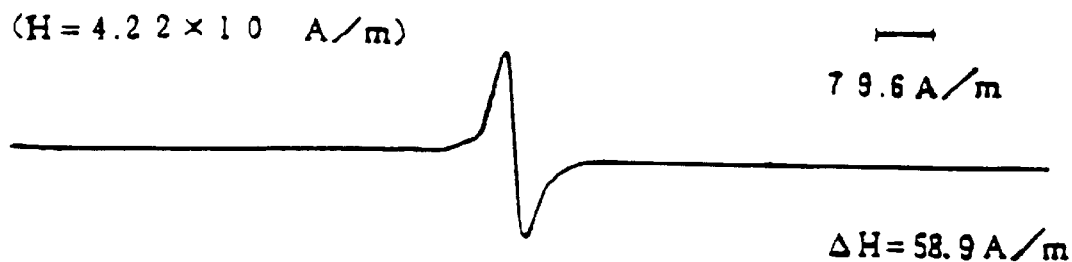
FIGS. 6A to 6E are waveform diagrams showing ferromagnetic resonance signals and linewidths corresponding to the Kittel mode at each area of measurement on the wafer specimen of FIG. 5.
Figure 6B:
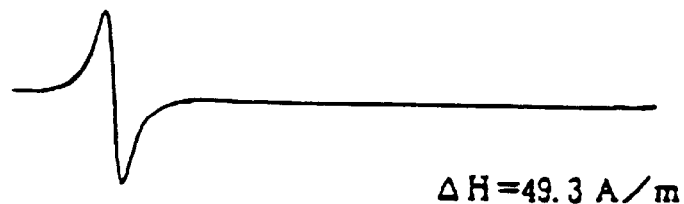
Figure 6C:
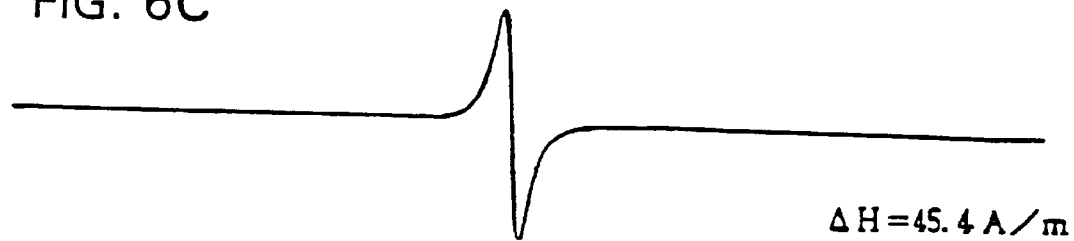
Figure 6D:
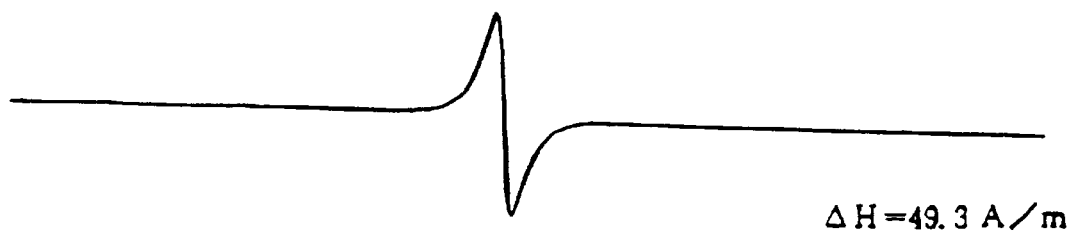
Figure 6E:
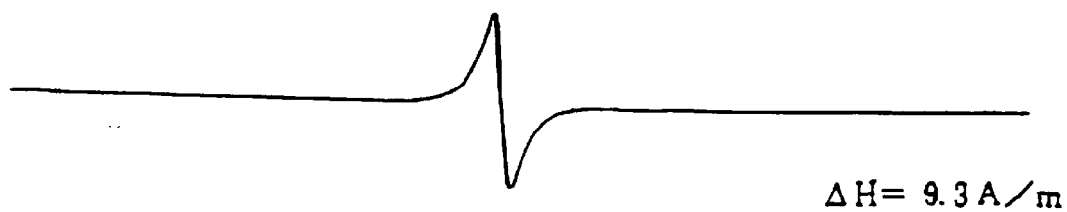

As an example, ferromagnetic resonance signals were measured with and without the ferromagnetic plate 22, and the test results are shown in FIGS. 4A and 4B. FIG. 4A shows the test result without the ferromagnetic plate 22, and FIG. 4B shows the test result with the ferromagnetic plate 22 employed. The signal corresponding to the Kittel-mode that appears when the spins in the ferromagnetic material are concurrently in precession is normally detected at a high level and a high magnetic field position. FIG. 4C shows another example of ferromagnetic resonance signals. The signals were measured with the ferromagnetic plate 22, wherein the ferromagnetic plate 22 has a through-hole 24 about 3.0 mm in diameter. The side wall 14 of the ferromagnetic resonance cavity 10 also has a through-hole 20 of about a 3.0 mm diameter. Although the peak corresponding to the Kittel mode appears at the high magnetic field position of the signals, the peak is smaller than the peaks corresponding to the higher order modes. This means that the measurement of the ferromagnetic resonance half-value width ($\Delta H$) may be less accurate than that obtained in the case where the through-holes 20 and 24 have about a 2.0 mm diameter.

As a result of further study, it has been found that the intensity of the peak corresponding to the Kittel mode depends on the uniformity of the internal field in the object to be measured and that the internal field in the object is kept sufficiently uniform if the through-hole 24 formed in the ferromagnetic plate 22 is about 2.0 mm or less. Therefore, the diameter D of the through-holes formed in the cavity resonator and the ferromagnetic plate is preferably within the range of $0.0 < D \leq 2.0$ (mm). Practically, it may be difficult to form a through-hole having a diameter less than 1.0 mm. In view of the practical matter, the optimal diameter of the through-holes is about 1.5 mm. In FIG. 4A, the ferromagnetic resonance signal is detected at a microwave frequency of 9.54 GHz, but the Kittel mode signal cannot be observed. In contrast, in FIG. 4B, the signal corresponding to the Kittel mode is detected at a high level, and thus measurement of the resonance magnetic field and ferromagnetic resonance half-value width ($\Delta H$) is possible.

Figure 5:
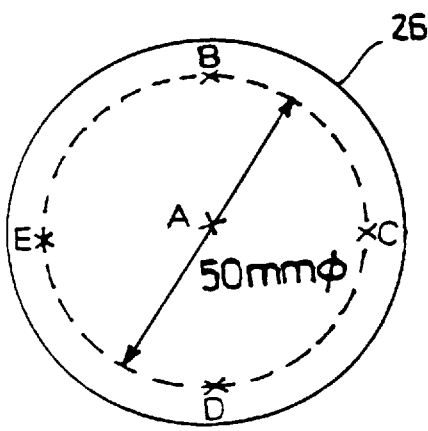
FIG. 5 is a plan view showing the areas of measurement on the disk-like wafer specimen having a diameter of 76 mm.

Furthermore, ferromagnetic resonance signals and linewidths corresponding to the Kittel mode were measured at a plurality of locations on the wafer specimen 26. As shown in FIG. 5, ferromagnetic resonance signals were measured at a center point A of the wafer specimen 26 (having a 76 mm diameter) and four areas B, C, D and E spaced along a circle of 50 mm diameter centered at point A. Test results are shown in FIGS. 6A to 6E. For the wafer specimen 26 used in this test, each area exhibited a narrow ferromagnetic resonance half-value width which confirmed that a high-quality single crystal was formed. Further, a chip of 1 mm by 1 mm was cut from the wafer specimen and the ferromagnetic resonance was measured. A nearly identical ferromagnetic resonance half-value width was obtained.

Figure 7:
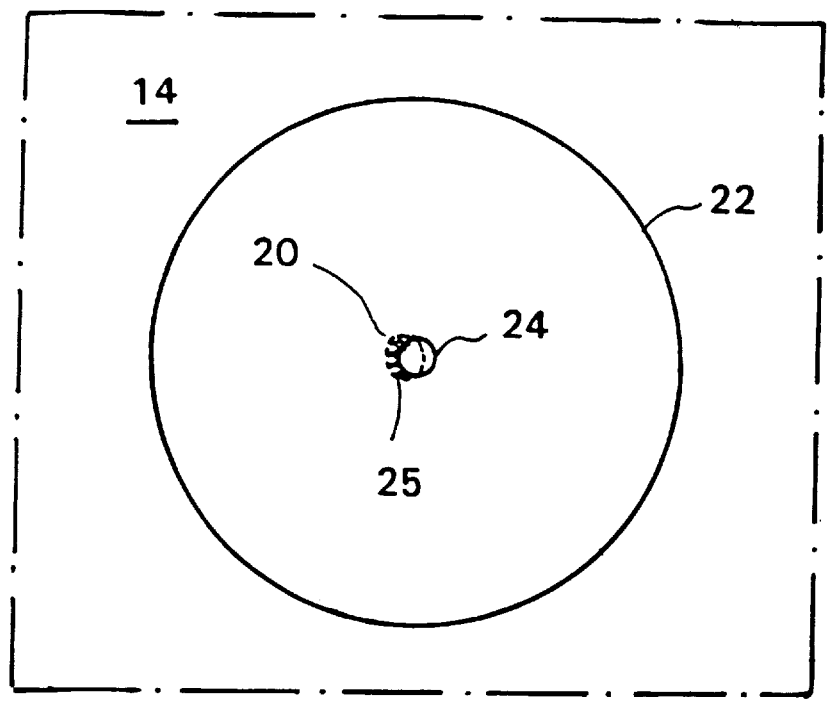
FIG. 7 illustrates an example in which the through-hole of the ferromagnetic plate is in misalignment with the through-hole of the cavity resonator.

As has been explained in detail, in the ferromagnetic resonance measuring cavity resonator according to the disclosed embodiment, it is required that the through-hole 24 of the ferromagnetic plate 22 is aligned with the through-hole 20 provided in the side wall 14 of the cavity resonator. As shown in FIG. 7, if the through-hole 24 of the ferromagnetic plate 22 is not aligned with the through-hole 20 provided in the side wall 14 of the cavity resonator, a portion 25 of the ferromagnetic plate 22 is exposed to a static magnetic field in the cavity resonator through the through-hole 20. In this case, a ferromagnetic component of the portion 25 of the ferromagnetic plate 22 is electromagnetically coupled with the cavity resonator. This prevents the correct signal from being obtained. Therefore, in order to establish the accurate alignment between the through-hole 20 and the through-hole 24, it is preferable that the through-hole 20 and the through-hole 24 are simultaneously formed by drilling the ferromagnetic plate 22 and the side wall 14 after the ferromagnetic plate 22 is attached to the side wall 14.

Figure 8:
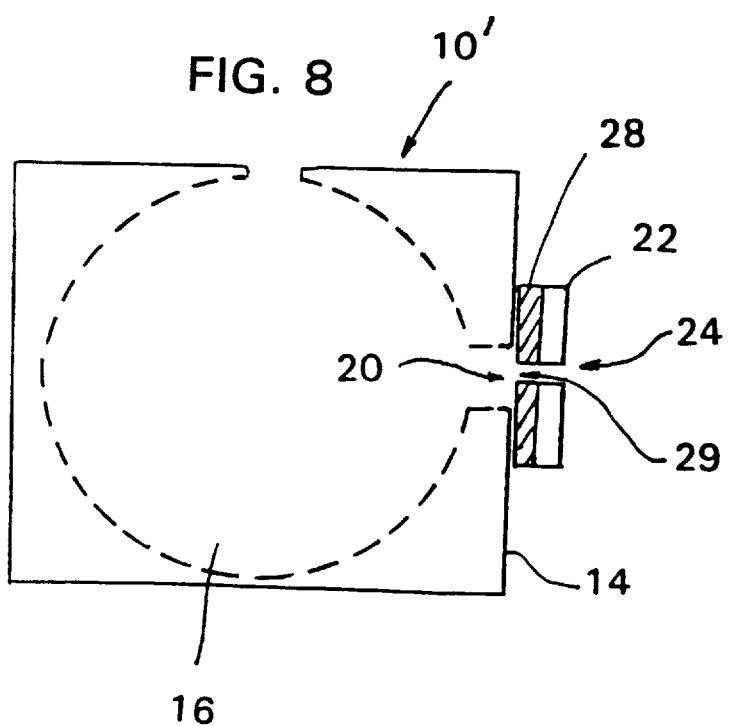
FIG. 8 shows a cross-sectional view of a ferromagnetic resonance cavity resonator according to another embodiment of the present invention.

Alternatively, the ferromagnetic resonance measuring cavity resonator may be modified as shown in FIG. 8. Specifically, in the ferromagnetic resonance measuring cavity resonator 10', the through-hole 20 provided in the side wall 14 has a greater diameter than that of the through-hole 24 provided in the ferromagnetic plate 22. Moreover, a non-magnetic conductor 28 is provided between the side wall 14 and the ferromagnetic plate 22, and a through hole 29 having the same diameter as the through hole 24 is formed in the non-magnetic conductor 28.

It is preferable that the through-hole 29 and through-hole 24 are simultaneously formed after the non-magnetic conductor 28 is attached to the ferromagnetic plate 22 so that the through hole 29 is precisely aligned with the through-hole 24 of the ferromagnetic plate 22. For example, the non-magnetic conductor 28 of a copper film is formed on the surface of the ferromagnetic plate 22 by a plating method, and the ferromagnetic plate 22 with the non-magnetic conductor 28 may be drilled. The non-magnetic conductor 28 of a copper film may be also formed on one side of the ferromagnetic plate 22 after the through hole 24 is formed in the ferromagnetic plate 22. Alternatively, a thin copper film having a about 0.05 mm thickness may be attached to the ferromagnetic plate 22 and then the thin copper film and ferromagnetic plate 22 may be drilled. Although the non-magnetic conductor 28 shown in FIG. 8 has the same size as the ferromagnetic plate 22, the non-magnetic conductor 28 may be either larger than or smaller the ferromagnetic plate 22 as long as the non-magnetic conductor 28 is larger than the through-hole 20 of the side wall 14.

The diameter of the through-hole 20 of the side wall 14 is sufficiently large so that the through-hole 29 which coincides with the through-hole 24 of the ferromagnetic plate 22 can be easily aligned within the through-hole 20 with respect to the diameter direction of the through-hole 20. For example, if the through-hole 29 and the through-hole 24 has a diameter of about 1.5 mm, the through-hole 20 may have a diameter of about 8.0 mm.

According to this construction, since the non-magnetic conductor 28 shields the ferromagnetic plate 22, the ferromagnetic component from the ferromagnetic plate 22 never enters into the cavity 16 through the through-hole 20, and is never electromagnetically coupled with the cavity resonator 10'. Thus, correct measurement can be achieved while the precise alignment between the through-hole 20 and the through-hole 24 can be made unnecessary.

As described above, using the electron spin resonance measuring instrument 30 having the ferromagnetic resonance measuring cavity resonator 10 of the present invention, the wafer specimen 26 having a large area may be measured at any arbitrary location for ferromagnetic resonance half-value width ($\Delta H$). Therefore, cutting the wafer specimen 26 into small chips for the purpose of the measurement of magnetic characteristics is not required. Thus, the characteristics are efficiently measured and the yield of chips to be used as devices is enhanced. Although in the above embodiment, an iron plate was used as the ferromagnetic plate 22, it was found that other materials may be used as long as they are ferromagnetic materials.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A ferromagnetic resonance measuring cavity resonator for use in measuring electron spin resonance of a ferromagnetic material, comprising:

a cavity resonator having a cavity formed by a side wall, the side wall provided with a through-hole and an input/output hole; and a ferromagnetic plate having therein a through-hole, the ferromagnetic plate mounted on the side wall of the cavity resonator so that the through-hole formed in the side wall of the cavity resonator is aligned with the through-hole formed in the ferromagnetic plate, wherein the diameter D of the through-hole formed in the ferromagnetic plate is within a range of $0.0 < D \leq 2.0$ (mm).

2. The ferromagnetic resonance measuring cavity resonator according to claim 1, wherein the through-hole of the ferromagnetic plate has substantially the same diameter as the through-hole of the side wall.

3. The ferromagnetic resonance measuring cavity resonator according to claim 1, wherein the diameter D of the through-hole formed in the side wall of the cavity resonator and the through-hole formed in the ferromagnetic plate is about 1.5 (mm).

4. The ferromagnetic resonance measuring cavity according to claim 1, wherein said cavity resonator is sized for operation in the traverse electric mode and a frequency of 8 to 12 Ghz.

5. The ferromagnetic resonance measuring cavity resonator according to claim 1, wherein said ferromagnetic plate is iron.

6. A ferromagnetic resonance measuring cavity resonator for use in measuring electron spin resonance of a ferromagnetic material, comprising:

a cavity resonator having a cavity formed by a side wall, the side wall provided with a through-hole and an input/output hole;

a ferromagnetic plate having therein a through-hole, the ferromagnetic plate mounted on the side wall of the cavity resonator so that the through-hole formed in the side wall of the cavity resonator is aligned with the through-hole formed in the ferromagnetic plate;

a non-magnetic conductor having therein a through-hole, the non-magnetic conductor placed between the side wall of the cavity resonator and the ferromagnetic plate so that the through-hole formed in the side wall of the cavity resonator is aligned with both the through-hole formed in the ferromagnetic plate and the through-hole formed in the non-magnetic conductor.

7. The ferromagnetic resonance measuring cavity resonator according to claim 6, wherein the through-hole of the ferromagnetic plate and the through-hole of the non-magnetic conductor have substantially the same diameter, and the through-hole of the side wall has lager diameter than the through-hole of the ferromagnetic plate and the through-hole of the non-magnetic conductor.

8. The ferromagnetic resonance measuring cavity resonator according to claim 7, wherein the diameter D of the through-hole formed in the ferromagnetic plate and the diameter D of the through-hole formed in the non-magnetic conductor are within a range of $0.0 < D \leq 2.0$ (mm).

9. The ferromagnetic resonance measuring cavity resonator according to claim 8, wherein the diameters D of the through-hole of the ferromagnetic plate and the non-magnetic conductor are about 1.5 (mm).

10. The ferromagnetic resonance measuring cavity according to claim 6, wherein the non-magnetic conductor is a copper film.

11. The ferromagnetic resonance measuring cavity according to claim 10, wherein the non-magnetic conductor is formed on the ferromagnetic plate by a plating method.

12. The ferromagnetic resonance measuring cavity resonator according to claim 6, wherein said ferromagnetic plate is iron.

13. The ferromagnetic resonance measuring cavity according to claim 6, wherein said cavity resonator is sized for operation in the traverse electric mode and a frequency of 8 to 12 Ghz.

14. An electron spin resonance measuring apparatus comprising:

a microwave generator;

a ferromagnetic resonance measuring cavity resonator electromagnetically connected with the microwave generator, the ferromagnetic resonance measuring cavity resonator including: a cavity resonator having a cavity formed by a side wall, the side wall provided with a through-hole and an input/output hole; a ferromagnetic plate having therein a through-hole, the ferromagnetic plate mounted on the side wall of the cavity resonator so that the through-hole formed in the side wall of the cavity resonator is aligned with the through-hole formed in the ferromagnetic plate, wherein the diameter D of the through-hole formed in the ferromagnetic plate is within a range of $0.0 < D \leq 2.0$ (mm); and a holder for supporting a wafer specimen such that the wafer is pressed against an outside surface of the ferromagnetic plate;

a first electromagnet and a first magnetic modulation coil provided on one side of the ferromagnetic resonance measuring cavity resonator and a second electromagnet and second magnetic modulation coil provided on anther side of the ferromagnetic resonance measuring cavity resonator to provide a uniform static magnetic field to the ferromagnetic resonance measuring cavity resonator; and a microwave sensor device, electromagnetically connected with the ferromagnetic resonance measuring cavity resonator, for detecting a ferromagnetic resonance signal.

15. The electron spin resonance measuring apparatus according to claim 14, wherein the through-hole of the ferromagnetic plate has substantially the same diameter as the through-hole of the side wall.

16. The electron spin resonance measuring apparatus according to claim 14, wherein the diameter D of the through-hole formed in the side wall of the cavity resonator and the through-hole formed in the ferromagnetic plate is about 1.5 (mm).

17. The electron spin resonance measuring apparatus according to claim 14, wherein said cavity resonator is sized for operation in the traverse electric mode and a frequency of 8 to 12 Ghz.

18. The electron spin resonance measuring apparatus according to claim 14, wherein said ferromagnetic plate is iron.

19. The electron spin resonance measuring apparatus according to claim 14, further comprising a circulator which couples the microwave generator and the microwave sensing device to the ferromagnetic resonance measuring cavity resonator.

20. An electron spin resonance measuring apparatus comprising:

a microwave generator;

a ferromagnetic resonance measuring cavity resonator electromagnetically connected with the microwave generator, the ferromagnetic resonance measuring cavity resonator including: a cavity resonator having a cavity formed by a side wall, the side wall provided with a through-hole and an input/output hole; a ferromagnetic plate having therein a through-hole, the ferromagnetic plate mounted on the side wall of the cavity resonator so that the through-hole formed in the side wall of the cavity resonator is aligned with the through-hole formed in the ferromagnetic plate, a non-magnetic conductor having therein a through-hole, the non-magnetic conductor placed between the side wall of the cavity resonator and the ferromagnetic plate so that the through-hole formed in the side wall of the cavity resonator is aligned with both the through-hole formed in the ferromagnetic plate and the through-hole formed in the non-magnetic conductor, and a holder for supporting a wafer specimen such that the wafer is pressed against an outside surface of the ferromagnetic plate;

a first electromagnet and a first magnetic modulation coil provided on one side of the ferromagnetic resonance measuring cavity resonator and a second electromagnet and second magnetic modulation coil provided on anther side of the ferromagnetic resonance measuring cavity resonator to provide a uniform static magnetic field to the ferromagnetic resonance measuring cavity resonator; and a microwave sensor device, electromagnetically connected with the ferromagnetic resonance measuring cavity resonator, for detecting a ferromagnetic resonance signal.

21. The electron spin resonance measuring apparatus according to claim 20, wherein the through-hole of the ferromagnetic plate and the through-hole of the non-magnetic conductor have substantially the same diameter, and the through-hole of the side wall has lager diameter than the through-hole of the ferromagnetic plate and the through-hole of the non-magnetic conductor.

22. The electron spin resonance measuring apparatus according to claim 21, wherein the diameter D of the through-hole formed in the ferromagnetic plate and the diameter D of the through-hole formed in the non-magnetic conductor are within a range of $0.0 < D \leq 2.0$ (mm).

23. The electron spin resonance measuring apparatus according to claim 22, wherein the diameters D of the through-hole of the ferromagnetic plate and the non-magnetic conductor are about 1.5 (mm).

24. The electron spin resonance measuring apparatus according to claim 20, wherein the non-magnetic conductor is a copper film.

25. The electron spin resonance measuring apparatus according to claim 24, wherein the non-magnetic conductor is formed on the ferromagnetic plate by a plating method.

26. The electron spin resonance measuring apparatus according to claim 20, wherein said ferromagnetic plate is iron.

27. The electron spin resonance measuring apparatus according to claim 20, wherein said cavity resonator is sized for operation in the traverse electric mode and a frequency of 8 to 12 Ghz.

28. The electron spin resonance measuring apparatus according to claim 20, further comprising a circulator which couples the microwave generator and the microwave sensing device to the ferromagnetic resonance measuring cavity resonator.

* * * * *